US012707934B2

(12) United States Patent
Huo

(10) Patent No.: US 12,707,934 B2
(45) Date of Patent: Aug. 11, 2026

(54) MICRODEVICE SUBSTRATE, DISPLAY PANEL, PREPARATION METHOD, AND DISPLAY APPARATUS

(71) Applicant: Tianma Advanced Display Technology Institute (Xiamen) Co., Ltd., Xiamen (CN)

(72) Inventor: Sitao Huo, Xiamen (CN)

(73) Assignee: Tianma Advanced Display Technology Institute (Xiamen) Co., Ltd., Xiamen (CN)

( * ) Notice: Subject to any disclaimer, the term of this patent is extended or adjusted under 35 U.S.C. 154(b) by 407 days.

(21) Appl. No.: 18/369,887

(22) Filed: Sep. 19, 2023

(65) Prior Publication Data

US 2024/0006220 A1 Jan. 4, 2024

(30) Foreign Application Priority Data

Jun. 19, 2023 (CN) ......................... 202310728785.3

(51) Int. Cl.
*H10P 72/70* (2026.01)
*H10W 90/00* (2026.01)

(52) U.S. Cl.
CPC ............. *H10P 72/74* (2026.01); *H10W 90/00* (2026.01); *H10P 72/7412* (2026.01); *H10P 72/7438* (2026.01)

(58) Field of Classification Search
CPC .. H10P 72/74; H10P 72/7412; H10P 72/7424; H10P 72/7426; H10P 72/7434; H10P 72/7438; H10W 90/00; H10H 20/01; G09F 9/33
See application file for complete search history.

(56) References Cited

U.S. PATENT DOCUMENTS

2011/0244396 A1* 10/2011 Aoki ..................... G03F 7/7075 414/800
2020/0013761 A1* 1/2020 Chaji ..................... H10D 86/40

FOREIGN PATENT DOCUMENTS

CN 108137311 A 6/2018

* cited by examiner

*Primary Examiner* — Hoai V Pham
(74) *Attorney, Agent, or Firm* — KDW FIRM PLLC

(57) ABSTRACT

Provided are a microdevice substrate, a display panel, a preparation method, and a display apparatus. The microdevice substrate includes a base substrate, multiple microdevices disposed on one side of the base substrate, and support structures. The support structures are connected to the multiple microdevices. A support structure includes a first support portion and a second support portion. The first support portion is fixedly connected to the base substrate. The second support portion is connected between a microdevice and the first support portion. The microdevice and the second support portion are suspended on the same side of the base substrate. A guide structure is disposed on the second support portion. The guide structure affects a broken position of the second support portion after being stressed.

17 Claims, 16 Drawing Sheets

MICRODEVICE SUBSTRATE, DISPLAY PANEL, PREPARATION METHOD, AND DISPLAY APPARATUS

CROSS-REFERENCE TO RELATED APPLICATION

This application claims priority to Chinese Patent Application No. 202310728785.3, filed on Jun. 19, 2023, the disclosure of which is incorporated herein by reference in its entirety.

TECHNICAL FIELD

Embodiments of the present application relate to the field of display technologies and, in particular, to a microdevice substrate, a display panel, a preparation method, and a display apparatus.

BACKGROUND

With the development of display technologies, various types of display apparatuses are constantly emerging and are more widely used in various industries. Compared with liquid crystal display in which a backlight module needs to be provided, an active light-emitting device has higher brightness and contrast ratio, so the market occupancy of the active light-emitting device is increased year by year.

In the active light-emitting device, in addition to an organic light-emitting diode (OLED) formed by using an organic light-emitting material, a micro light-emitting diode (micro-LED) and a sub-millimeter light-emitting diode (mini-LED) which are formed by using an inorganic light-emitting material are also a hotspot of research. Different from an OLED device in which an evaporation process is used, a micro-LED and a mini-LED generally use a mass transfer technology to form a display panel. When devices are transferred, some devices have residual support structures. This has adverse effects on subsequent processes and leads to low yield of display panels.

SUMMARY

Embodiments of the present application provide a microdevice substrate, a display panel, a preparation method, and a display apparatus. A microdevice in the microdevice substrate may be a micro-LED or a mini-LED. A guide structure is disposed on a support structure so that the guide structure controls the broken position of the support structure when a microdevice is transferred, thereby reducing residue and improving the yield of display panels.

In a first aspect, an embodiment of the present application provides a microdevice substrate. The microdevice substrate includes a base substrate, a plurality of microdevices disposed on one side of the base substrate, and support structures.

The support structures are connected to the plurality of microdevices.

A support structure includes a first support portion and a second support portion. The first support portion is fixedly connected to the base substrate. The second support portion is connected between a microdevice and the first support portion. The microdevice and the second support portion are suspended on the same side of the base substrate.

A guide structure is disposed on the second support portion. The guide structure affects the broken position of the second support portion after being stressed.

In a second aspect, an embodiment of the present application also provides a method for preparing a microdevice substrate. The method includes providing a first substrate and a base substrate; forming a plurality of microdevices on one side of the first substrate; transferring the plurality of microdevices to the base substrate, and forming support structures connecting the plurality of microdevices and the base substrate, where a support structure includes a first support portion and a second support portion, the first support portion is fixedly connected to the base substrate, the second support portion is connected between a microdevice and the first support portion, and the microdevice and the second support portion are suspended on the same side of the base substrate; and forming at least one guide structure on the second support portion.

In a third aspect, an embodiment of the present application also provides a method for preparing a microdevice substrate. The method includes providing a base substrate provided with a plurality of accommodation grooves; forming a sacrificial layer in the plurality of accommodation grooves; forming a plurality of microdevices and support structures in sequence on a side of the sacrificial layer facing away from the base substrate, where a support structure includes a first support portion and a second support portion, the first support portion is fixedly connected to the base substrate, the second support portion is connected between a microdevice and the first support portion; removing the sacrificial layer so that the microdevice and the second support portion are suspended on the same side of the base substrate; and forming at least one guide structure on the second support portion.

In a fourth aspect, an embodiment of the present application also provides a display panel. The display panel includes a substrate and a plurality of microdevices disposed on one side of the substrate.

Edges of a microdevice of at least part of the plurality of microdevices are connected to at least one support portion residual structure, and the support portion residual structure is provided with at least one of the following: at least one hollow structure or at least one groove.

In a fifth aspect, an embodiment of the present application also provides a method for preparing a display panel. The method includes providing a microdevice substrate, where the microdevice substrate includes a base substrate, a plurality of microdevices disposed on one side of the base substrate, and support structures, where the support structures are connected to the plurality of microdevices, a support structure includes a second support portion, and a guide structure is disposed on the second support portion; providing a substrate; and removing a microdevice from the microdevice substrate and then transferring the microdevice to the substrate, where the support structure is broken from a position of the guide structure when the microdevice is transferred, and at least part of the second support portion is removed with the microdevice to form a support portion residual structure.

In a sixth aspect, an embodiment of the present application also provides a display apparatus. The display apparatus includes the preceding display panel.

DETAILED DESCRIPTION

Figure 1:
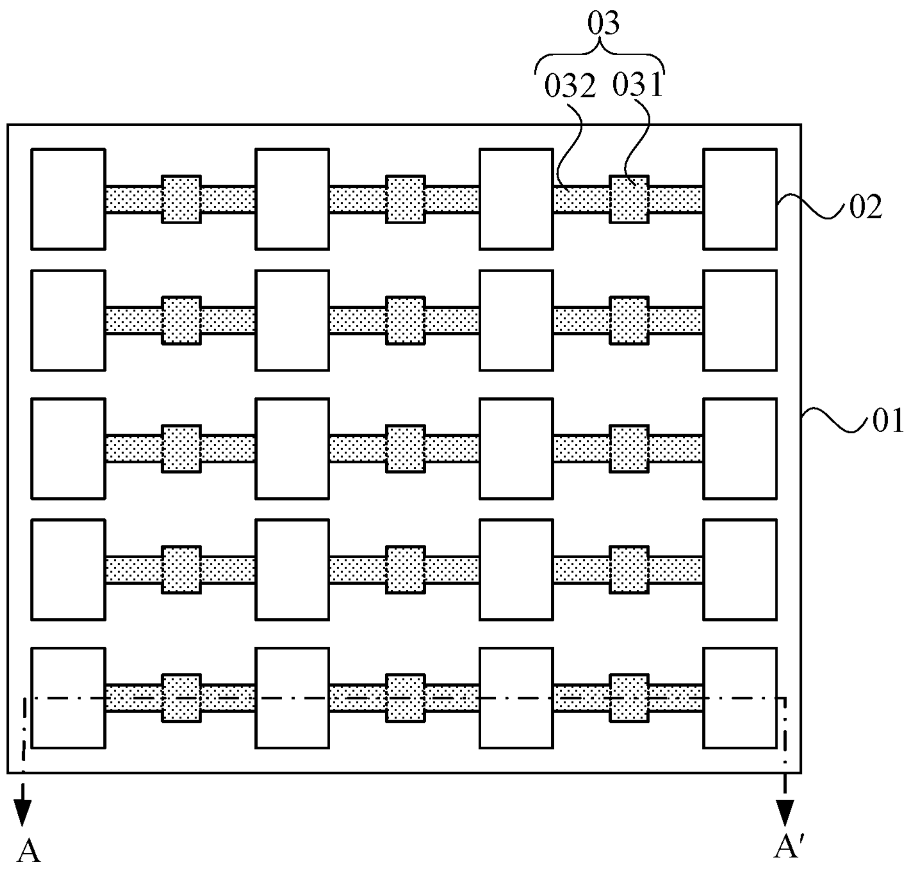
FIG. 1 is a top diagram illustrating the structure of a microdevice substrate in the related art.

The present application is further described hereinafter in detail in conjunction with drawings and embodiments. It is to be understood that embodiments described hereinafter are merely intended to explain the present application and not to limit the present application. Additionally, it is to be noted that for ease of description, only part, not all, of structures related to the present application are illustrated in the drawings.

Terms used in embodiments of the present application are merely used for describing the specific embodiments and not intended to limit the present application. It is to be noted that nouns of locality, including "on", "below", "left", and "right", used in the embodiments of the present application, are described from the angles illustrated in the drawings and are not to be construed as a limitation to the embodiments of the present application. Additionally, in the context, it is to be understood that when an element is formed "on" or "below" another element, the element may be directly formed "on" or "below" another element, or may be indirectly formed "on" or "below" another element via an intermediate element. The terms "first", "second", and the like are merely used for description and used for distinguishing between different components rather than indicate any order, quantity, or importance. For those of ordinary skill in the art, the preceding terms can be construed according to specific situations in the present application.

Figure 2:
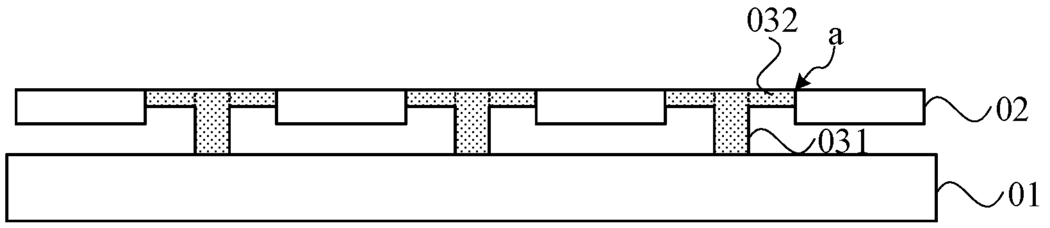
FIG. 2 is a sectional view taken along line AN in FIG. 1.

FIG. 1 is a top diagram illustrating the structure of a microdevice substrate in the related art FIG. 2 is a sectional view taken along line AA' in FIG. 1. Referring to FIG. 1 and FIG. 2, the microdevice substrate includes a base substrate 01. The base substrate 01 is used as a substrate for carrying microdevices 02. For example, the base substrate 01 may be a sapphire substrate. A microdevice 02 may be a micro-LED or a mini-LED prepared by using a semiconductor epitaxial growth method. Multiple microdevices 02 arranged in an array are formed on the same base substrate 01. Subsequently, the multiple microdevices 02 of different light-emitting colors are arranged in a preset order by using a mass transfer technique to form a display panel for color display. The different light-emitting colors may include red, green, and blue. To facilitate the transfer of the microdevices 02, the microdevice substrate is also provided with support structures 03 connected to the microdevices 02. A support structure 03 includes a first support portion 031 and a second support portion 032. The first support portion 031 is fixedly connected to the base substrate 01. The second support portion 032 is connected between a microdevice 02 and the first support portion 031 so that the microdevice 02 and the second support portion 032 are suspended above the base substrate 01. When the microdevice 02 is removed from the base substrate 01, the second support portion 032 is broken. In an ideal state, the second support portion 032 is broken from the root portion a close to a side of the microdevice 02. However, in an actual transfer process, each time a microdevice 02 is transferred, the stress on a second support portion 032 is different, and a broken position is uncontrollable. At least part of the second support portion 032 can be removed with the microdevice 02 with a high probability. That is, the transferred microdevice 02 has the residue of the support structure. The residual support structure does not belong to the functional structure of the microdevice 02 and has no effect on the display function of the display panel. Moreover, the residual structure may cause adverse effects on subsequent processes of the display panel and affect the yield of display panels.

To solve the preceding problems, an embodiment of the present application provides a microdevice substrate. The microdevice substrate includes a base substrate, multiple microdevices disposed on one side of the base substrate. and support structures. The support structures are connected to the multiple microdevices. A support structure includes a first support portion and a second support portion. The first support portion is fixedly connected to the base substrate. The second support portion is connected between a microdevice and the first support portion. The microdevice and the second support portion are suspended on the same side of the base substrate. A guide structure is disposed on the second support portion. The guide structure affects the broken position of the second support portion after being stressed.

According to the technical solution in this embodiment of the present application, by setting the support structures connected to the microdevices, the support structures make the microdevices suspend on one side of the base substrate so that the microdevices can be successfully removed during transfer. By setting a guide structure on a second support portion, the guide structure causes the root portion of the second support portion close to a side of a microdevice to be broken with a high probability to reduce the residue of the support structure on the microdevice and improve the yield of display panels.

The preceding is the core idea of this embodiment of the present application. Embodiments of the present application are described below in conjunction with the drawings. It is to be noted that the number, shape, and the like of devices in the drawings in the following embodiments are merely used for illustratively explaining the structure in each embodiment of the present application and are not intended to limit the embodiments of the present application.

Figure 3:
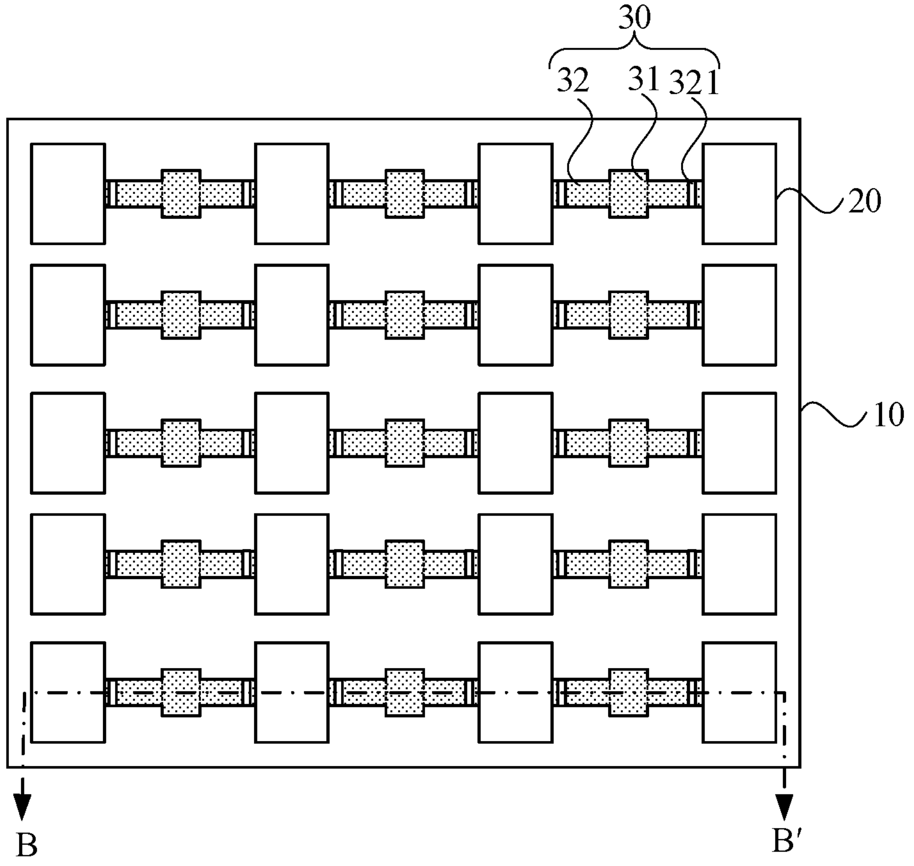
FIG. 3 is a top diagram illustrating the structure of a microdevice substrate according to an embodiment of the present application.
Figure 4:
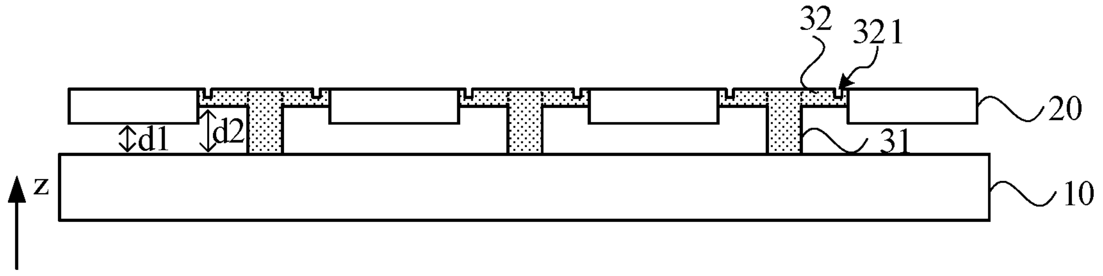
FIG. 4 is a sectional view taken along line BB' in FIG. 3.

FIG. 3 is a top diagram illustrating the structure of a microdevice substrate according to an embodiment of the present application. FIG. 4 is a sectional view taken along line BB' in FIG. 3. Referring to FIG. 3 and FIG. 4, the microdevice substrate provided in this embodiment includes a base substrate 10, multiple microdevices 20 located on one side of the base substrate and support structures 30. The support structures 30 are connected to the microdevices 20. In addition to microdevices 20 located in the edge region, one of the microdevices 20 is connected to at least two support structures 30. The support structure 30 includes a first support portion 31 and a second support portion 32. The first support portion 31 is fixedly connected to the base substrate 10. That is, the first support portion 31 is a support pillar structure. The second support portion 32 is connected between a microdevice 20 and the first support portion 31. The microdevice 20 and the second support portion 32 are suspended on the same side of the base substrate 10. A guide structure 321 is disposed on the second support portion 32. The guide structure 321 affects the broken position of the second support portion 32 after being stressed.

The guide structure 321 may be a groove disposed on the second support portion 32. As shown in FIG. 3 and FIG. 4, the guide structure 321 may be disposed at the root portion of the second support portion 32 close to a side of the microdevice 20. The groove may be disposed to reduce the thickness of the second support portion 32. When the microdevice 20 needs to be removed, the stress is concentrated in the position of the groove. The position in which the groove is disposed is more easily broken than other positions, thereby reducing the residue of the support structure when the microdevice 20 is removed.

Figure 5:
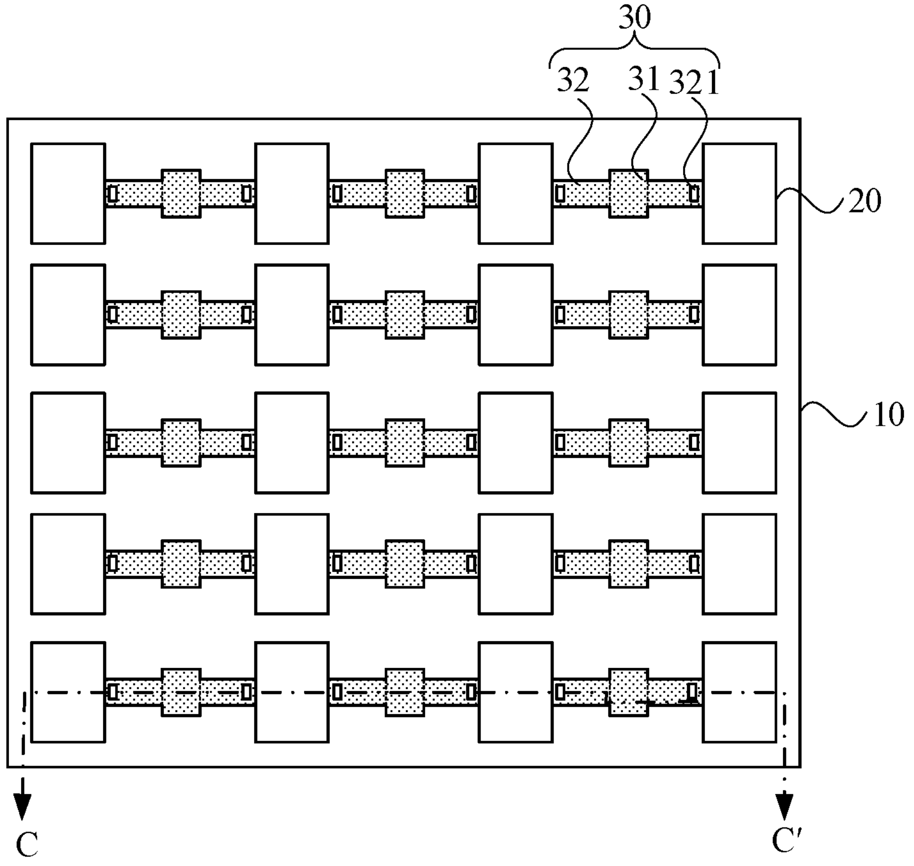
FIG. 5 is a top diagram illustrating the structure of another microdevice substrate according to an embodiment of the present application.
Figure 6:
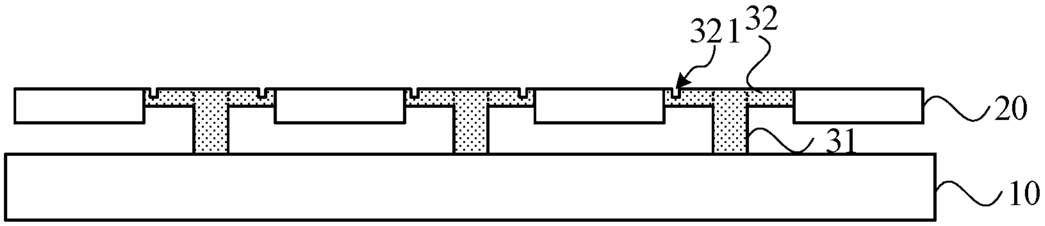
FIG. 6 is a sectional view taken along line CC' in FIG. 5.

To be noted, it is merely illustrative that the length of the guide structure 321 shown in FIG. 3 and FIG. 4 is the same as the width of the second support portion 32. In other embodiments, the length of the guide structure 321 may be less than the width of the second support portion 32. In addition, the width of the first support portion 31 being greater than the width of the second support portion 32 shown in the top diagram in this embodiment is merely illustrative and is not intended to limit this embodiment of the present application. In other embodiments, the width of the first support portion 31 may be set equal to the width of the second support portion 32, or the width of the first support portion 31 may be set less than the width of the second support portion 32. It is merely illustrative that a microdevice 20 located in the edge region is connected to one second support portion 32, and a microdevice 20 located in the middle region is connected to two second support portions 32. In other embodiments, a microdevice 20 located in the edge region may also be connected to two second support portions 32 to avoid tilting of the microdevice 20 due to disposing the support structure on one side. A guide structure 321 may be disposed on each second support portion 32. In another embodiment, a second support portion 32 may be disposed on each of four sides of a microdevice 20. This may be designed according to actual conditions during implementation. Exemplarily, FIG. 5 is a top diagram illustrating the structure of another microdevice substrate according to an embodiment of the present application. FIG. 6 is a sectional view taken along line CC' in FIG. 5. Referring to FIG. 5 and FIG. 6, unlike the embodiments of FIG. 3 and FIG. 4, the length of a guide structure 321 is less than the width of a second support portion 32. It is merely illustrative that the center of the guide structure 321 coincides with the center of the width of the second support portion 32. This may be designed according to actual conditions during implementation.

Figure 7:
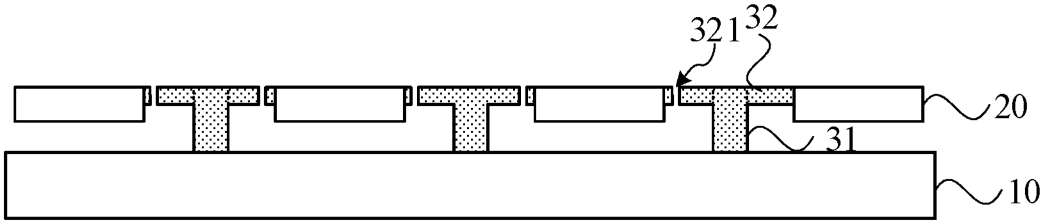
FIG. 7 is a sectional view taken along line CC' in FIG. 5.

In another embodiment, a guide structure 321 may also be a hollow structure penetrating through a second support portion 32. Exemplarily, FIG. 7 is a sectional view taken along line CC' in FIG. 5. In FIG. 7, a guide structure 321 penetrates through a second support portion 32 and also has the effect of guiding the second support portion 32 to break. It is to be noted that FIG. 7 is a sectional view of FIG. 5. The port of the second support portion at the position of the guide structure 321 cut by a sectional line is actually still connected to two sides, as shown by the rightmost second support structure 32 whose guide structure is not cut by the sectional line.

In another embodiment, a guide structure 321 may include both a hollow structure and a groove. This may be designed according to actual conditions during implementation and is not limited in the embodiments of the present application. In this embodiment of the present application, optionally, a guide structure 321 includes at least one of a hollow structure or a one groove. The guide structure 321 is disposed to reduce the residue of the support structure when a microdevice 20 is removed and avoid the residual structure affecting the subsequent process.

Figure 8:
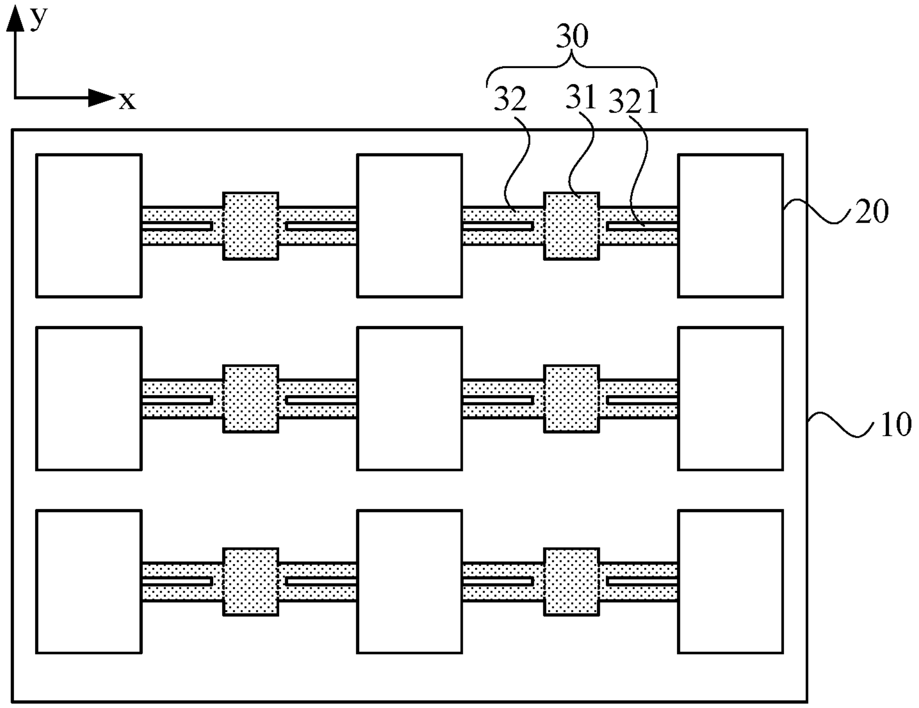
FIG. 8 is a top diagram illustrating the structure of another microdevice substrate according to an embodiment of the present application.

FIG. 8 is a top diagram illustrating the structure of another microdevice substrate according to an embodiment of the present application. Referring to FIG. 8, optionally, an orthographic projection of a guide structure 321 on a base substrate 10 extends along a first direction x. The first direction x intersects the edge of a second support portion 32 close to a side of a microdevice 20.

During implementation, the guide structure 321 may be a groove disposed in the second support portion 32 or a hollow structure penetrating through the second support portion 32. Alternatively, part of the guide structure 321 may be a groove, and part of the guide structure 321 may be a hollow structure. This may be designed according to actual conditions during implementation. In some embodiments, a second support portion 32 may be connected to the position of a corner of a microdevice 20, that is, to two adjacent sides of the microdevice 20. In this case, the position of a corner may be considered to be one vertex. The probability of the guide structure 321 passing through the vertex is small. In this case, the extension direction of the guide structure 321 is set to intersect any side connected to the microdevice 20.

Optionally, along the direction (a second direction y) perpendicular to the first direction x and parallel to the plane in which the base substrate is located, the size of the guide structure 321 is larger than 2 μm. The first direction x is the same as the extension direction of the guide structure 321. The first direction x intersects the edge of the second support portion 32 close to a side of the microdevice 20. By setting the width of the guide structure 321 larger than 2 μm, it is advantageous to guide the second support portion 32 to break.

When the guide structure 321 is designed as a groove, the closer the guide structure 321 is to the microdevice 20, the deeper the depth of the groove or the larger the width of the groove may be designed to facilitate the broken position of the second support portion 32 to be close to one side of the microdevice 20. The depth of the groove is the size in the direction perpendicular to the base substrate 10. The width of the groove is the size in the direction (second direction y) parallel to the base substrate 10.

Figure 9:
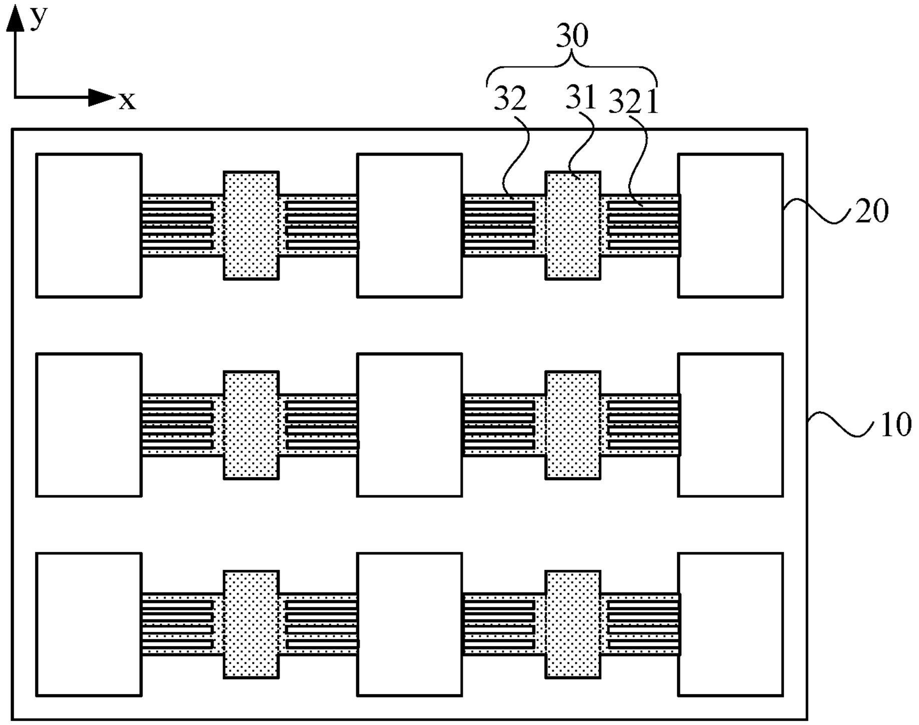
FIG. 9 is a top diagram illustrating the structure of another microdevice substrate according to an embodiment of the present application.

FIG. 9 is a top diagram illustrating the structure of another microdevice substrate according to an embodiment of the present application. Referring to FIG. 9, optionally, a second support portion 32 is provided with multiple guide structures 321. Orthographic projections of the multiple guide structures 321 on a base substrate 10 are arranged along a second direction y. The second direction y intersects a first direction x.

In this embodiment, multiple guide structures 321 arranged along the second direction y are provided. Compared with the manner that only one guide structure 321 is provided, the guide structures 321 are more easily broken when the second support portion 32 is stressed, and a better effect is achieved. The guide structure 321 may be designed to be at least one of a hollow structure or a one groove according to actual conditions. This may be designed according to actual conditions during implementation.

Figure 10:
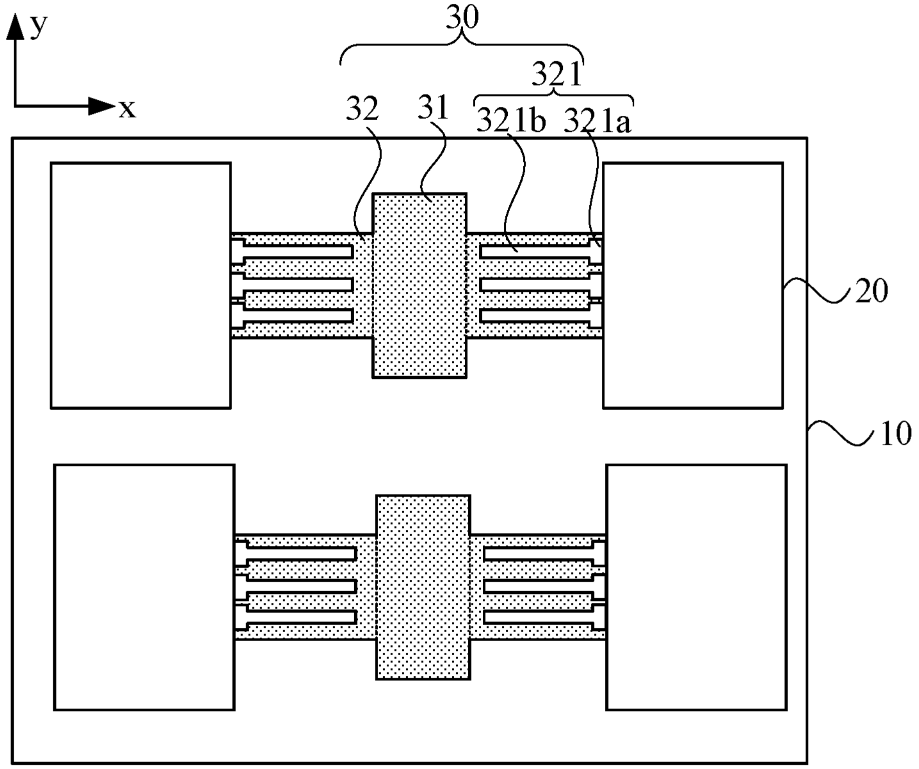
FIG. 10 is a top diagram illustrating the structure of another microdevice substrate according to an embodiment of the present application.

In an embodiment, to increase the probability that a second support portion breaks at the side close to a microdevice, shapes of guide structures in different regions can be set to be different. FIG. 10 is a top diagram illustrating the structure of another microdevice substrate according to an embodiment of the present application. Referring to FIG. 10, optionally, a guide structure 321 includes a first region **321*a* and a second region 321*b* which are communicated with each other. The first region 321*a* is disposed between the second region 321*b* and a microdevice 20. The size of the first region 321*a* in a second direction y is greater than the size of the second region 321*b*** in the second direction y. The second direction y intersects a first direction x.

It is to be understood that the first region **321*a* of the guide structure 321 is disposed on the side of the second support portion 32 close to the microdevice 20. The size of the first region 321*a* in the second direction y is set to be greater than the size of the second region 321*b* in the second direction y. That is, the width of the first region 321*a* is set to be greater than the width of the second region 321*b*. Since when the microdevice 20 is removed, the stress is generally concentrated in a position where the structure of the support structure has a sudden change. When the microdevice 20 is removed, the second support portion 32 is more advantageous to break from the root by setting a slot-like cut with a larger size at the root of a comb. During implementation, the first region 321*a* may be set as at least one of a hollow structure or a one groove. The second region 321*b* may be set as at least one of a hollow structure or a one groove. When the first region 321*a* and the second region 321*b* are each a groove, the depth of the groove of the first region 321*a* may be set to be greater than or equal to the depth of the groove of the second region 321*b*. This may be set according to actual situations and process. In an actual implementation, the size of the first region 321*a* in the second direction y can be set to be greater than the size of the second region 321*b* in the second direction y if conditions permit. The shape of the guide structure 321 is not limited to linear extension and may be a polyline or a curve, or a combination of the two. It is only necessary to design the guide structure 321 to facilitate the breaking of the second support portion 32** at the root.

Figure 11:
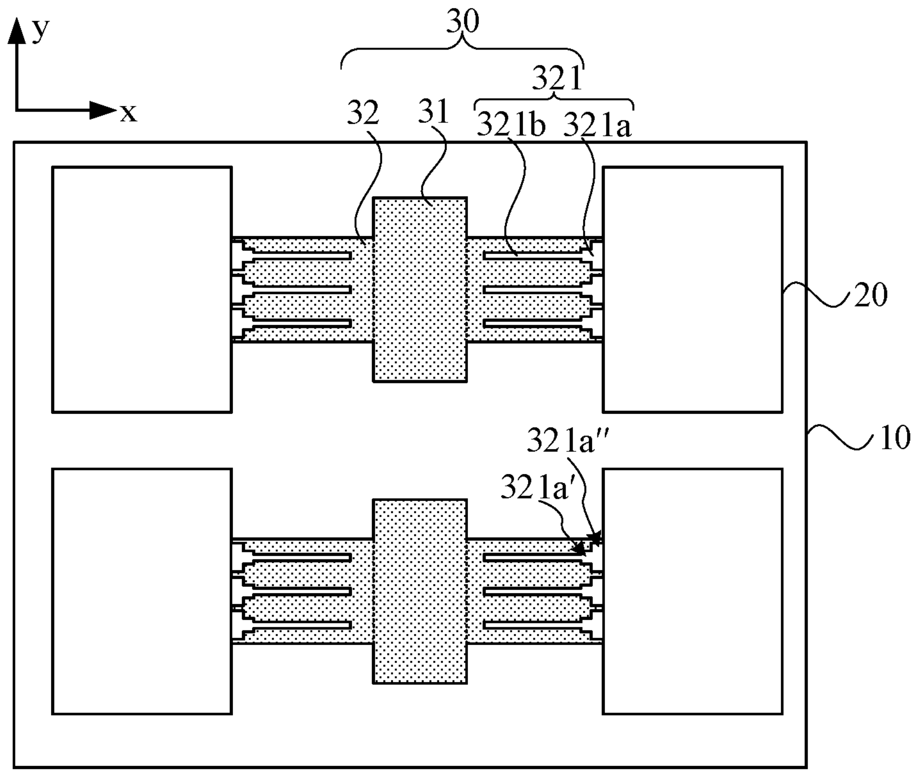
FIG. 11 is a top diagram illustrating the structure of another microdevice substrate according to an embodiment of the present application.

With continued reference to FIG. 10, optionally, the second support portion 32 is provided with multiple guide structures 321. Each of the multiple guide structures 321 includes a second region **321*b* and at least one first region 321*a*. FIG. 10 merely illustratively shows that each guide structure 321 includes one first region 321*a*. In other embodiments, multiple first regions 321*a* may be successively disposed at a position of a guide structure 321 close to a microdevice 20 so that a second support portion 32 is more easily broken in the vicinity of the first regions 321*a*. Exemplarily, two first regions are taken as an example. FIG. 11 is a top diagram illustrating the structure of another microdevice substrate according to an embodiment of the present application. Referring to FIG. 11, two first regions 321*a*' and 321*a*" are disposed at the position of a guide structure 321 close to a microdevice 20. The 321*a*" is closer to the microdevice 20. The size of 321*a*" in a direction y is greater than the size of 321*a*' in the direction y. That is, a guide structure may be provided with multiple-stage sudden changes to facilitate the second support portion 32 to break at the position close to the microdevice 20. During implementation, the difference between 321*a*" and 321*a*' may be set to be greater than the difference between 321*a*' and 321*b* so that the second support portion 32** is more easily broken at the root. In other embodiments, more stages and sizes of first regions may be provided.

This may be designed according to actual conditions during implementation. In other embodiments, to ensure the support performance of a second support portion 32 before a microdevice 20 is removed, part of a guide structure 321 may not be provided with a first region **321*a***. This may be flexibly selected according to actual conditions during implementation.

Optionally, at least one of the size of a first region or the size of a second region in a second direction increases along the direction in which the second region points towards the first region.

Figure 12:
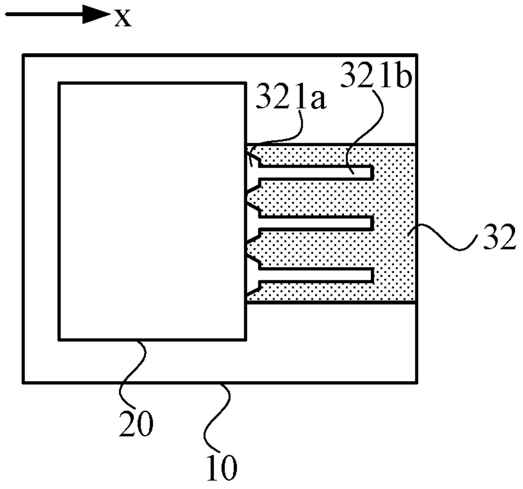
FIGS. 12 to 15 are partial top diagrams illustrating the structure of a microdevice substrate according to an embodiment of the present application.
Figure 13:
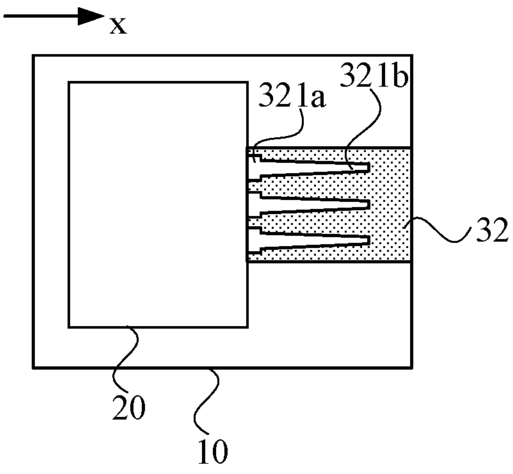
Figure 14:
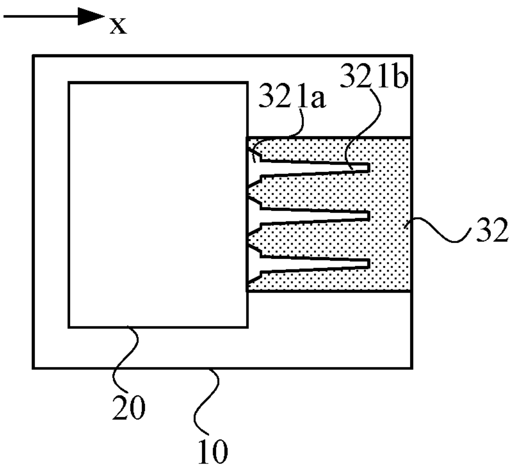
Figure 15:
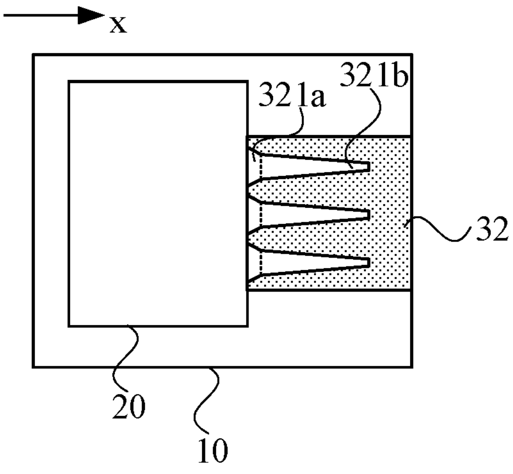

The larger the size of a guide structure in the second direction, the greater the probability that a second support portion breaks at this position. FIGS. 12 to 15 are partial top diagrams illustrating the structure of a microdevice substrate according to an embodiment of the present application. For simplicity, only one microdevice and one second support portion are shown in FIGS. 12 to 15. Referring to FIG. 12, along the direction in which a second region 321*b* points toward a first region 321*a* (that is, the opposite direction of a first direction x), the size of the first region 321*a* in a second direction y increases. That is, the closer the position to a microdevice 20, the larger the size of the first region 321*a*. This advantageously reduces the residue of the support structure when a second support portion 32 is broken. Referring to FIG. 13, along the direction in which a second region 321*b* points toward a first region 321*a*, the size of the second region 321*b* increases in a second direction y. Referring to FIG. 14 and FIG. 15, the size of the first region 321*a* and the size of the second region 321*b* increase in the second direction y. This has a similar effect to the embodiment of FIG. 12. The first region 321*a* and the second region 321*b* in the embodiments in FIGS. 12 to 14 have size sudden change, while the size sudden change does not exist in FIG. 15. This may be designed according to actual conditions during implementation.

Optionally, at least one of the following applies: at least two microdevices are connected to different numbers of second support portions, or relative positions of at least two microdevices and second support portions are different.

Figure 16:
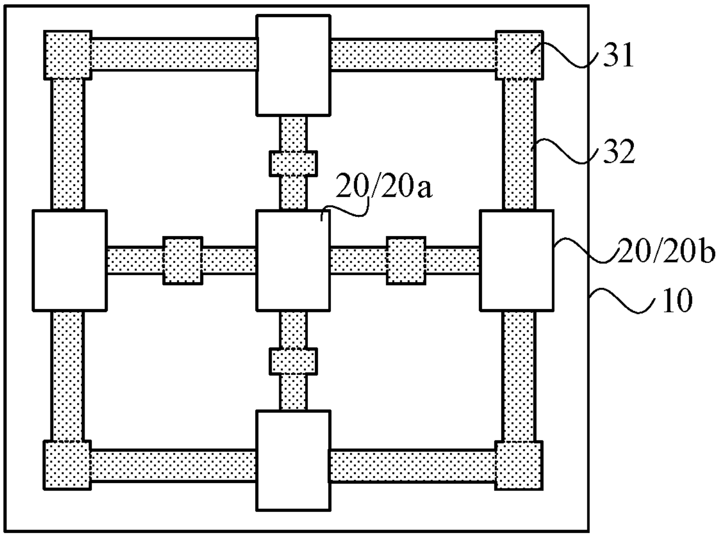
FIG. 16 is a top diagram illustrating the structure of another microdevice substrate according to an embodiment of the present application.

Exemplarily, FIG. 16 is a top diagram illustrating the structure of another microdevice substrate according to an embodiment of the present application. Referring to FIG. 16, five microdevices 20 are illustratively shown. A microdevice 20*a* located in the center is connected to four second support portions 32. A microdevice 20*b* located at the periphery is connected to three second support portions 32. At least one of the number or shapes of guide structures (not shown in FIG. 16) may vary with the number of second support portions 32 connected to microdevices 20 to make the broken positions of second support portions 32 as close as possible to microdevices 20.

Figure 17:
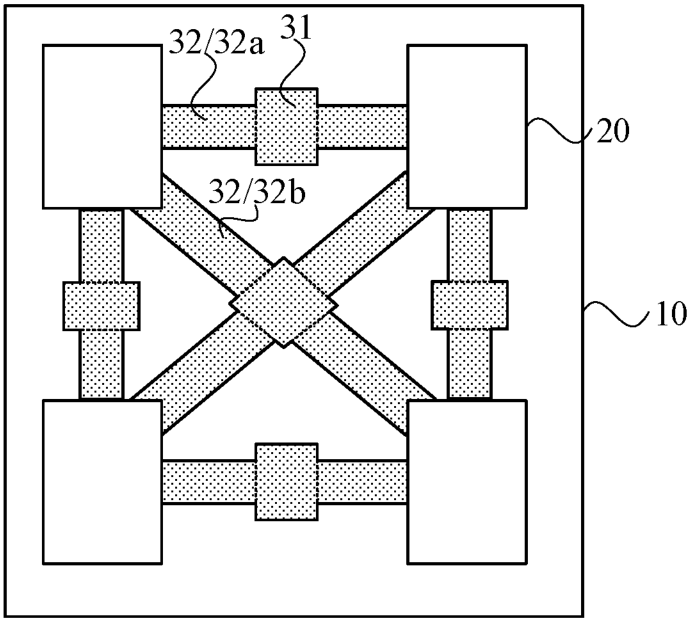
FIG. 17 is a top diagram illustrating the structure of another microdevice substrate according to an embodiment of the present application.

FIG. 17 is a top diagram illustrating the structure of another microdevice substrate according to an embodiment of the present application. Referring to FIG. 17, a second support portion 32*a* is connected to a straight side of a microdevice 20. A second support portion 32*b* is connected to a corner of the microdevice 20, thereby improving the support stability of the microdevice 20.

With continued reference to FIG. 16 or FIG. 17, optionally, an orthographic projection of a microdevice 20 on a base substrate 10 is a polygon. In FIG. 16 and FIG. 17, a rectangle is taken as an example and is not intended to limit the embodiments of the present application. At least part of second support portions 32 are connected to straight sides of microdevices 20. At least part of the second support portions 32 are connected to corners of microdevices 20. Optionally, at least part of second support portions 32 are connected to a straight side of one microdevice 20. At least part of the second support portions 32 are connected to a corner of another microdevice 20. This may be designed according to actual conditions during implementation.

Figure 18:
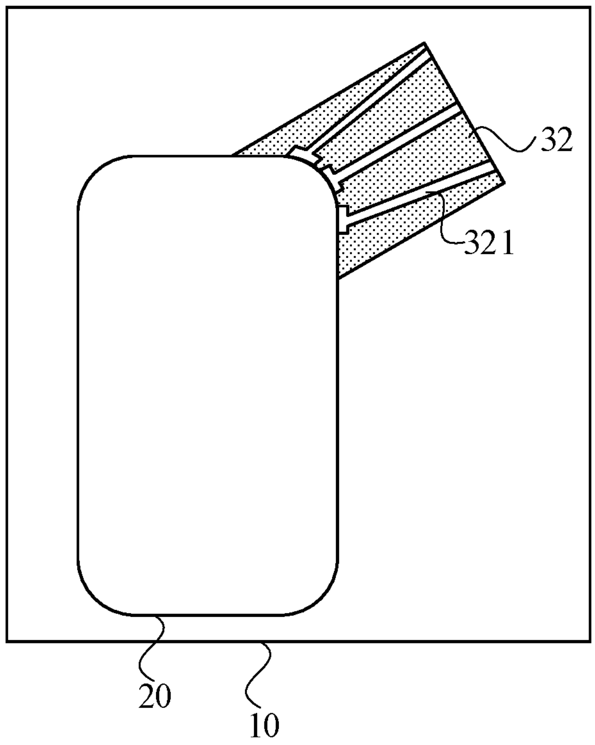
FIG. 18 is a partial top diagram illustrating the structure of another microdevice substrate according to an embodiment of the present application.

FIG. 18 is a partial top diagram illustrating the structure of another microdevice substrate according to an embodiment of the present application. Referring to FIG. 18, optionally, at least part of second support portions 32 are connected to corners of the microdevices 20. Multiple guide structures 321 are disposed on at least one of the at least part of the second support portions 32. Orthogonal projections of the multiple guide structures 321 are radially arranged on a base substrate 10.

By setting the orthogonal projections of the guide structures 321 in a radial arrangement on the base substrate 10, the density of the guide structures 321 on the side close to the microdevice 20 can be large, thereby facilitating the second support portion 32 to break at the root when the microdevice 20 is removed, and reducing the area of the residual structure.

Figure 19:
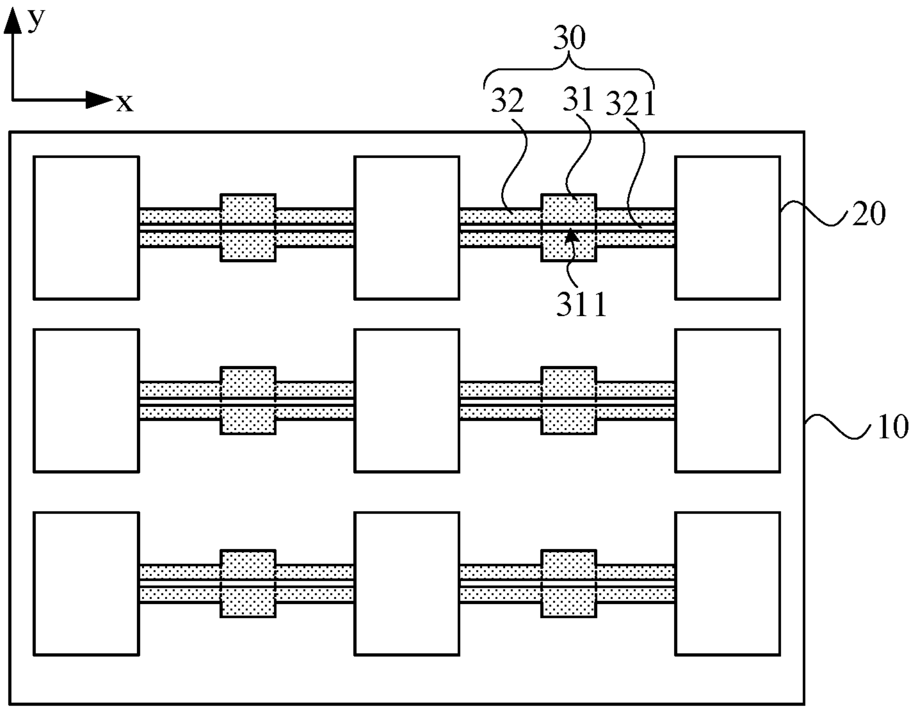
FIG. 19 is a top diagram illustrating the structure of another microdevice substrate according to an embodiment of the present application.

FIG. 19 is a top diagram illustrating the structure of another microdevice substrate according to an embodiment of the present application. Referring to FIG. 19, optionally, the side of a first support portion 31 facing away from a base substrate 10 is provided with a groove 311. The groove 311 is communicated with a guide structure 321 disposed on at least one side of the first support portion 31.

It is to be understood that a guide structure 321 is generally formed through a photolithography process. Since the size of a microdevice 20 and the gap between microdevices are relatively small, the process requirements for forming a guide structure 321 are relatively high. By disposing a groove 311 in a first support portion 31, the groove 311 can communicate with at least two guide structures 321, thereby facilitating the reduction of process difficulty.

With continued reference to FIG. 4, optionally, along a direction z perpendicular to the plane in which the base substrate 10 is located, the distance d1 between a microdevice 20 and the base substrate 10 is less than or equal to the distance d2 between a second support portion 32 and the base substrate 10.

It is to be understood that since the microdevice 20 includes structures such as an electrode and a semiconductor layer, insulation is required between different microdevices 20. The support structure is generally formed by an insulation structure. To facilitate removal of the microdevice 20, the thickness of the second support portion 32 is less than the thickness of the microdevice 20. Moreover, the support structure is generally formed later than the microdevice 20, that is, located above the microdevice 20 or in the same layer as the top of the microdevice. Therefore, $d1<d2$.

Figure 20:
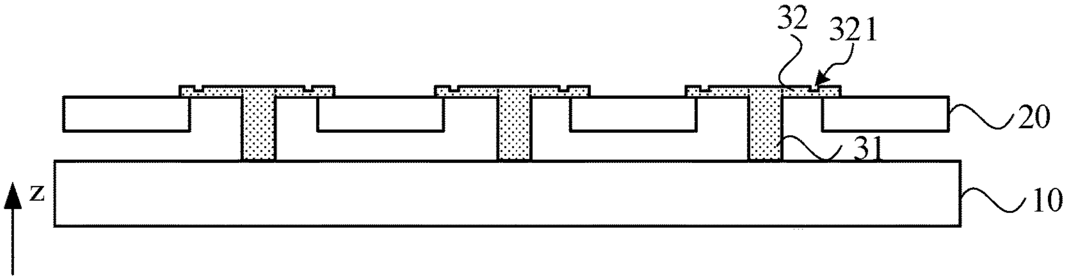
FIG. 20 is another sectional view taken along line BB' in FIG. 3.

In the embodiment shown in FIG. 4, a second support portion 32 is in the same layer as the top of a microdevice 20. In another embodiment, a second support portion 32 may be set above a microdevice 20, that is, connected to the top surface of the microdevice 20. Exemplarily, FIG. 20 is another sectional view taken along line BB' in FIG. 3. Referring to FIG. 20, a second support portion 32 is disposed on the top surface of a first support portion 31 and microdevice to facilitate the stabilization of the microdevice 20 and the pickup of the microdevice.

Optionally, the microdevice includes a micro light-emitting diode or a sub-millimeter light-emitting diode.

The micro light-emitting diode (micro-LED) technology is LED miniaturization and matrix technology. In brief, the micro-LED technology is the result of thin-film, miniaturization, and matrixing of LEDs and can make a LED unit smaller than 100 μm. Like OLED, the micro-LED technology can implement individual addressing of each pixel and individual driving luminescence (self-luminescence) and is considered as a next-generation display technology. The sub-millimeter light-emitting diode (mini-LED) uses LED crystal of 100 μm to 200 μm and is an improved version of a conventional LED. The mini-LED technology is considered as a transition technology between conventional LEDs and micro-LEDs. A display screen with 0.5 mm to 1.2 mm pixel particles can be produced by using the mini-LED. The display effect is much better than that of a conventional LED screen. The mini-LED can also be used for providing backlight for a liquid crystal screen and has better light uniformity performance.

Figure 21:
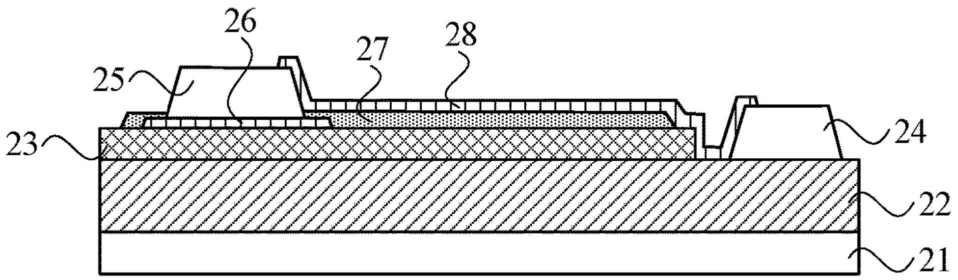
FIG. 21 is a diagram illustrating the film layer structure of a microdevice according to an embodiment of the present application.

A microdevice can be formed by using a normal-chip process or a flip-chip process. The normal-chip process and the flip-chip process have a similar film layer structure, but the difference is that a light-emitting direction is different. Taking the normal-chip process as an example, FIG. 21 is a diagram illustrating the film layer structure of a microdevice according to an embodiment of the present application. Referring to FIG. 21, the microdevice includes a substrate 21, an N-type layer 22, and a P-type layer 23 which are stacked in sequence. The substrate 21 may be sapphire. The N-type layer 22 may be N-type GaN. The P-type layer 23 may be P-type GaN. The interface between the N-type layer 22 and the P-type layer 23 forms a PN junction structure capable of emitting light. The microdevice also includes an N electrode 24 electrically connected to the N-type layer 22, a P electrode 25 electrically connected to the P-type layer 23, a current blocking layer 26, a current diffusion layer 27, and an optical function layer 28. The N electrode 24 and the P electrode 25 may be made of gold or an alloy of gold. The current blocking layer 26 may be made of silicon dioxide for reducing the loss of light caused by the current supplied from the P electrode 25 directly entering the P-type layer 23 downward. The current diffusion layer 27 may be a transparent conduction layer (for example, indium tin oxide (ITO)) for current diffusion to increase light-emitting area. The optical function layer 28 is made of a transparent optical material for improving light-emitting efficiency. The specific structure may be designed according to actual conditions. In this embodiment, a second support portion may be disposed in the same layer as the current blocking layer 26 or the optical function layer 28.

With continued reference to FIG. 8 or FIG. 9, optionally, the orthogonal projection of the guide structure 321 on the base substrate 10 intersects the orthogonal projection of the microdevice 20 on the base substrate 10. That is, the guide structure 321 is disposed to extend to the side of the microdevice 20. As seen along the direction perpendicular to the base substrate the guide structure 321 is connected to the edge of the microdevice 20. Since the stress is most concentrated at the position where the structure has a sudden change, this arrangement facilitates the second support portion 32 to break just at the edge of the microdevice 20, thereby reducing the risk of generating the residue of the support structure when the microdevice 20 is removed.

Figure 22:
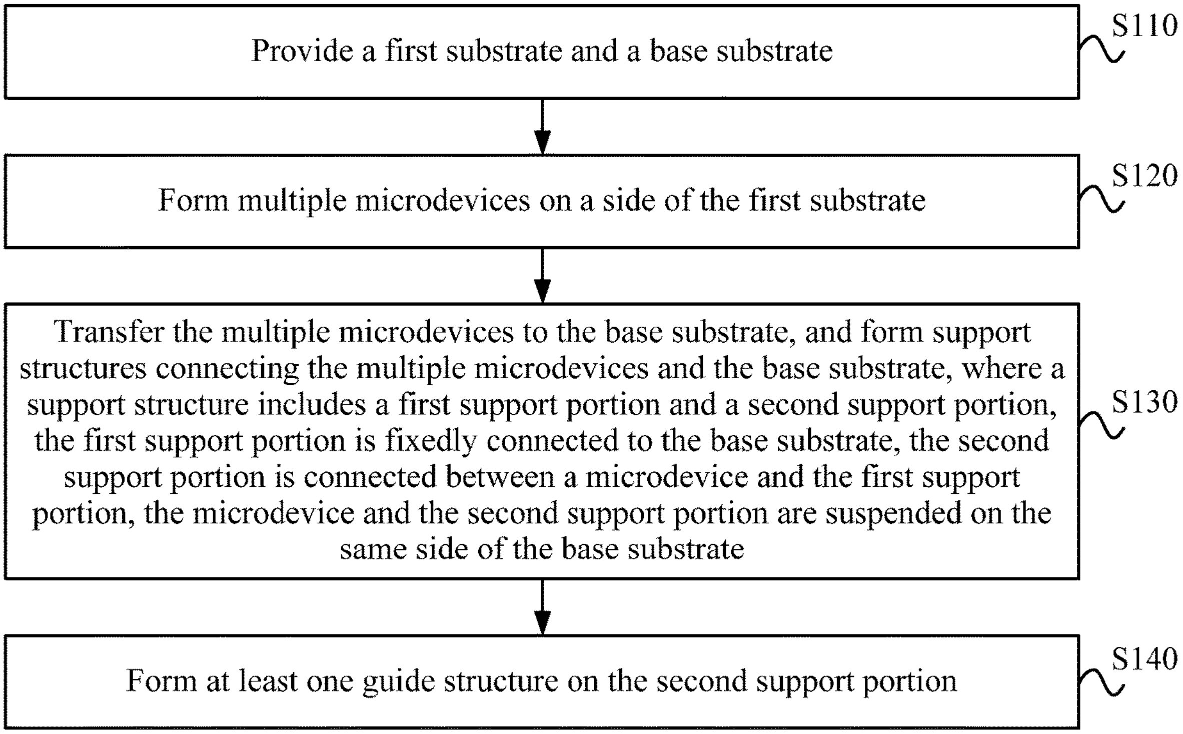
FIG. 22 is a flowchart of a method for preparing a microdevice substrate according to an embodiment of the present application.

FIG. 22 is a flowchart of a method for preparing a microdevice substrate according to an embodiment of the present application. The preparation method is used for preparing the microdevice substrate provided in any of the preceding embodiments. Referring to FIG. 22, the preparation method includes the following steps.

In S110, a first substrate and a base substrate are provided.

The first substrate is a substrate for forming a microdevice. The microdevice may be formed by using an epitaxial growth manner.

In S120, multiple microdevices are formed on a side of the first substrate.

A microdevice may be a micro-LED or a mini-LED.

In S130, the multiple microdevices are transferred to the base substrate. Support structures connecting the multiple microdevices and the base substrate are formed. The support structure includes a first support portion and a second support portion. The first support portion is fixedly connected to the base substrate. The second support portion is connected between a microdevice and the first support portion. The microdevice and the second support portion are suspended on the same side of the base substrate.

In S140, at least one guide structure is formed on the second support portion.

For the shape and function of the guide structure, reference may be made to the preceding embodiments. Details are not repeated here.

According to the method for preparing a microdevice substrate provided in this embodiment, first, multiple microdevices are grown on a first substrate. Then, the microdevices are transferred to a base substrate for arrangement. After the arrangement, support structures are formed. The first support portion and the second support portion in a support structure may be integrally formed. Finally, at least one of a hollow structure or a one groove is formed on the second support portion by using a photolithography process as a guide structure to form the microdevice substrate.

Figure 23:
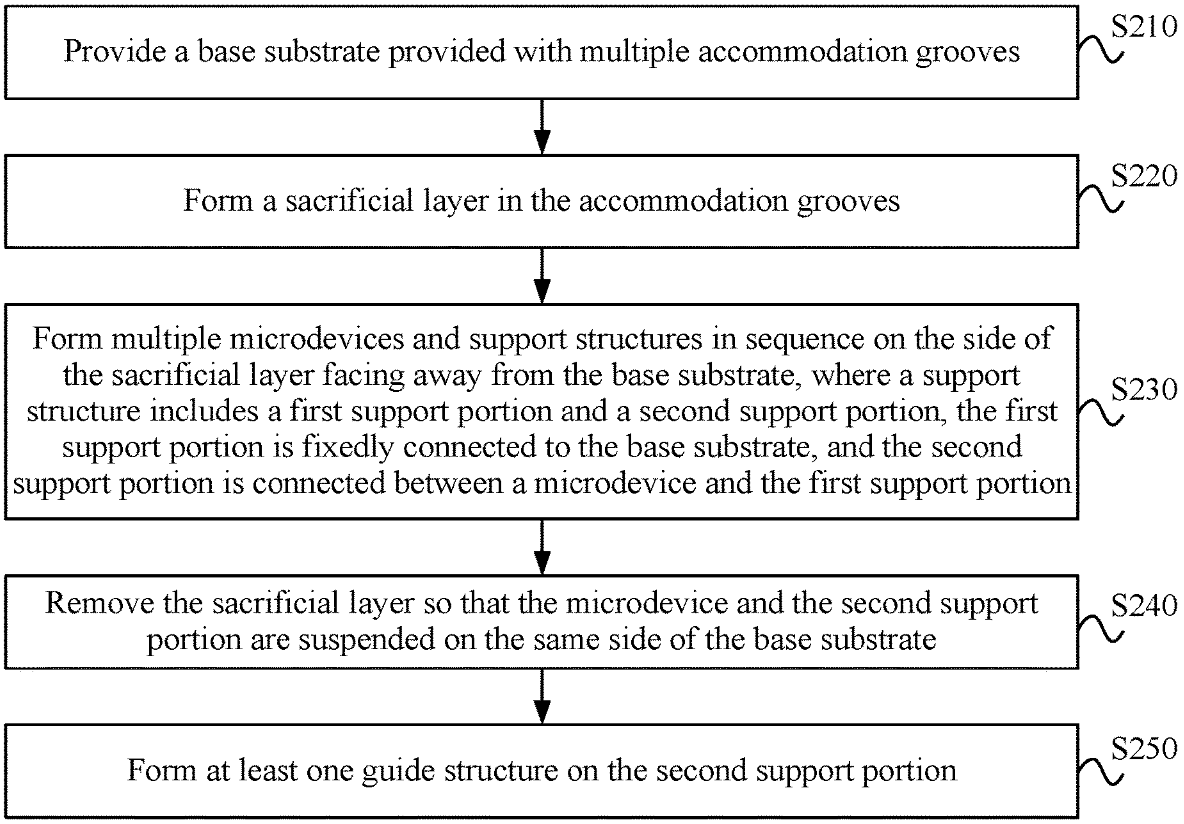
FIG. 23 is a flowchart of another method for preparing another microdevice substrate according to an embodiment of the present application.

FIG. 23 is a flowchart of another method for preparing a microdevice substrate according to an embodiment of the present application. The preparation method may also be used for preparing the microdevice substrate provided in any of the preceding embodiments. Referring to FIG. 23, the preparation method includes the following steps.

In S210, a base substrate provided with multiple accommodation grooves is provided.

In S220, a sacrificial layer is formed in the accommodation grooves.

In S230, multiple microdevices and support structures are formed in sequence on the side of the sacrificial layer facing away from the base substrate. A support structure includes a first support portion and a second support portion. The first support portion is fixedly connected to the base substrate. The second support portion is connected between a microdevice and the first support portion.

In S240, the sacrificial layer is removed so that the microdevice and the second support portion are suspended on the same side of the base substrate.

In S250, at least one guide structure is formed on the second support portion.

According to the method for preparing a microdevice substrate provided in this embodiment, first, accommodation grooves are disposed in a base substrate. Then, a sacrificial layer is formed in the accommodation grooves. After microdevices and support structures are formed in sequence, the sacrificial layer is removed to form a suspended structure. Finally, a guide structure is formed on a second support portion by using a photolithography process, thereby forming the microdevice substrate.

Figure 24:
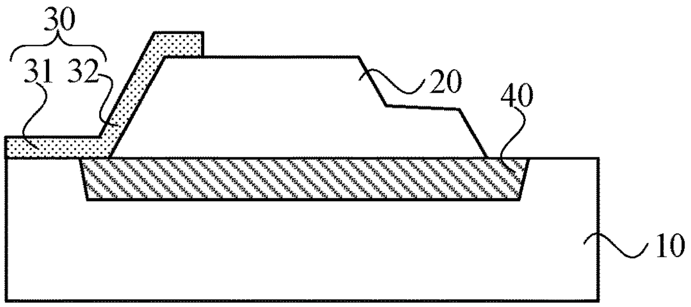
FIG. 24 is a diagram illustrating the structure of a microdevice substrate in a preparation process according to an embodiment of the present application.

Exemplarily, FIG. 24 is a diagram illustrating the structure of a microdevice substrate in a preparation process according to an embodiment of the present application. Referring to FIG. 24, the microdevice substrate includes a base substrate 10, a sacrificial layer 40, a microdevice 20, and a support structure 30. The support structure 30 includes a first support portion 31 and a second support portion 32. In FIG. 24, a specific structure and a guide structure of the microdevice 20 are not shown.

Figure 25:
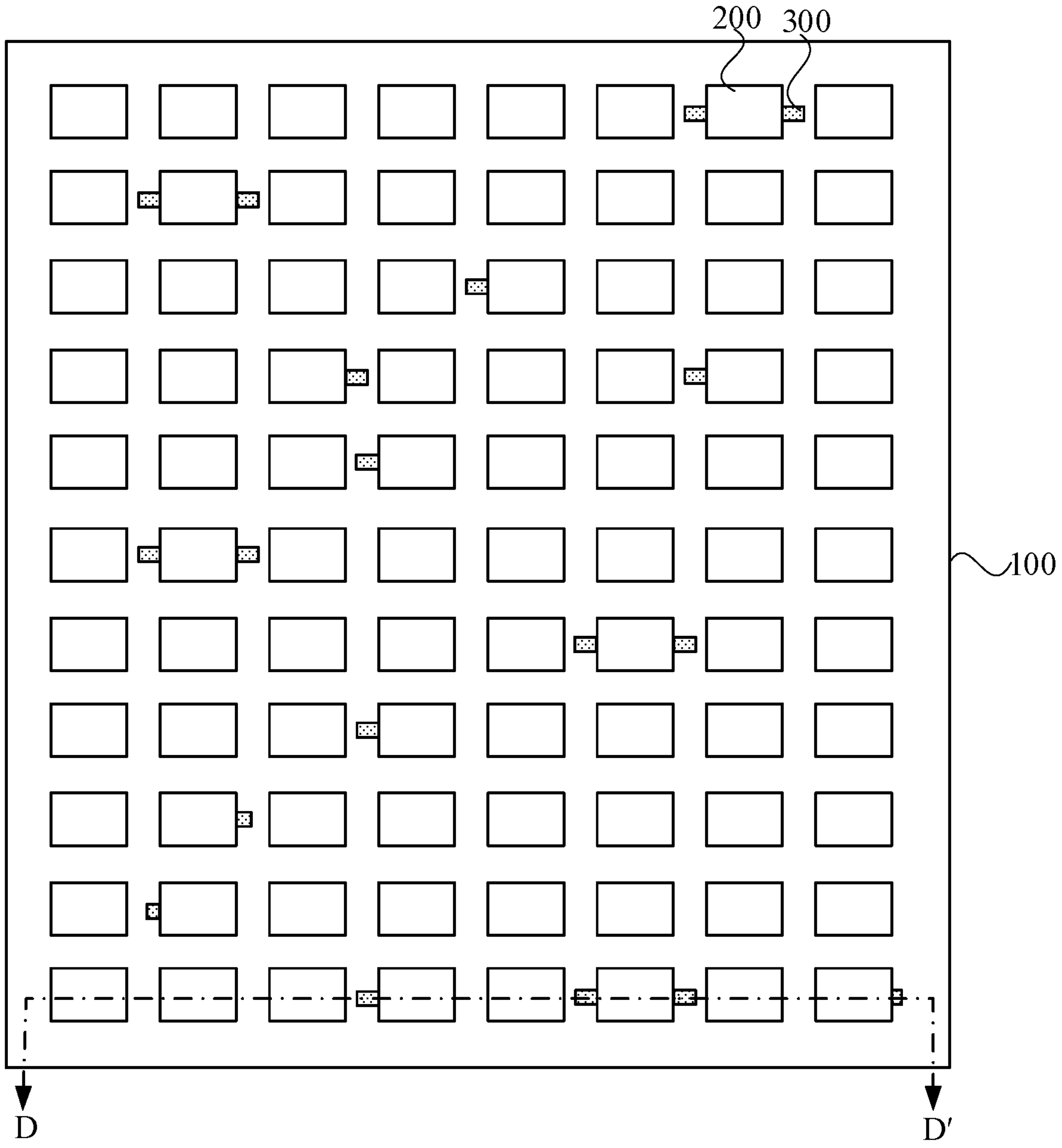
FIG. 25 is a top diagram illustrating the structure of a display panel according to an embodiment of the present application.
Figure 26:
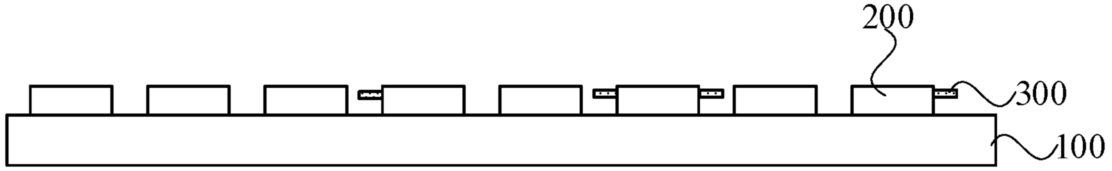
FIG. 26 is a sectional view taken along line DD' in FIG. 25.

FIG. 25 is a top diagram illustrating the structure of a display panel according to an embodiment of the present application. FIG. 26 is a sectional view taken along line DD' in FIG. Referring to FIG. 25 and FIG. 26, the display panel provided in this embodiment includes a substrate 100 and multiple microdevices 200 located on one side of the substrate 100. Edges of at least part of the microdevices 200 are connected to at least one support portion residual structure 300. At least one hollow structure, at least one groove, or both of the at least one hollow structure and the at least one groove are disposed on a support portion residual structure 300 (not shown in FIG. 25 and FIG. 26).

Microdevices 200 on the display panel are removed from the microdevice substrate provided in the preceding embodiments and are arranged in a preset order. A microdevice 200 may be a micro-LED or a mini-LED. For example, microdevices 200 may be removed from three types of microdevice substrates and include red light-emitting microdevices, blue light-emitting microdevices, and green light-emitting microdevices to form the display panel to implement color display. In another embodiment, only the blue light-emitting microdevices 200 may be provided, or only the green light-emitting microdevices 200 may be provided. In other embodiments, other types of microdevices 200 may be provided. This is not limited in the present application. It is to be understood that a guide structure is disposed in a support structure of the microdevice substrate, the residue of the support structure can be reduced compared with the related art. However, it is inevitable that part of microdevices 200 may have support portion residual structures 300 during mass transfer. A support portion residual structure 300 is at least part of a second support portion. Therefore, at least part of a guide structure, that is, at least one of a hollow structure or a one groove, is carried. It is to be noted that only part of microdevices 200 shown in FIG. 25 and FIG. 26 with support portion residual structures 300 are merely illustrative. In other embodiments, it is also possible that each of all microdevices 20 has a support portion residual structure 300. However, compared with the related art, the size of the support portion residual structure 300 is less than the size of a residual structure in the related art. Alternatively, an orthographic projection of at least one of a hollow structure or a one groove on the substrate intersects an orthographic projection of a microdevice on the substrate.

Figure 27:
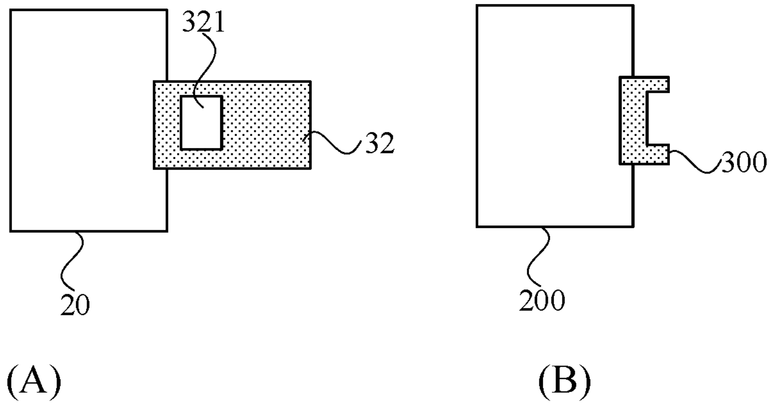
FIG. 27 is a comparison diagram of a second support portion before and after being broken according to an embodiment of the present application.

FIG. 27 is a comparison diagram of a second support portion before and after being broken according to an embodiment of the present application. Referring to FIG. 27, for simplicity, only one microdevice 20/200 and one second support portion 32 are shown in FIG. 27. A guide structure 321 is a hollow structure as an example. FIG. 27(A) shows the structure before the second support portion 32 is broken, that is, before the microdevice 20 is removed from a microdevice substrate. FIG. 27(B) shows the structure after the second support portion 32 is broken, that is, after the microdevice 20 is removed from the microdevice substrate and then transferred to a display panel. The second support portion is broken from the guide structure. Part of the second support portion remains on the microdevice 200 to form a support portion residual structure 300.

Optionally, a support portion residual structure has at least one of the following: multiple hollow structures or multiple grooves. At least one of the following: orthographic projections of the multiple hollow structures or orthographic projections of grooves on a substrate extend along a first direction and are arranged along a second direction. The first direction intersects the edge of the support portion residual structure close to a side of the microdevice. The second direction intersects the first direction.

Definitions of the first direction and second direction described herein are the same as those in the preceding embodiments. At least one of the following: multiple hollow structures or multiple grooves are formed on the support portion residual structure. The support portion residual structure corresponds to the preceding embodiments. Details are not repeated here.

Optionally, the size of a first end of a hollow structure in the second direction is greater than the size of a second end of the hollow structure in the second direction. The first end of the hollow structure is disposed between a microdevice and the second end of the hollow structure. Moreover/alternatively, the size of a first end of a groove in the second direction is greater than the size of a second end of the groove in the second direction. The first end of the groove is disposed between a microdevice and the second end of the groove.

Figure 28:
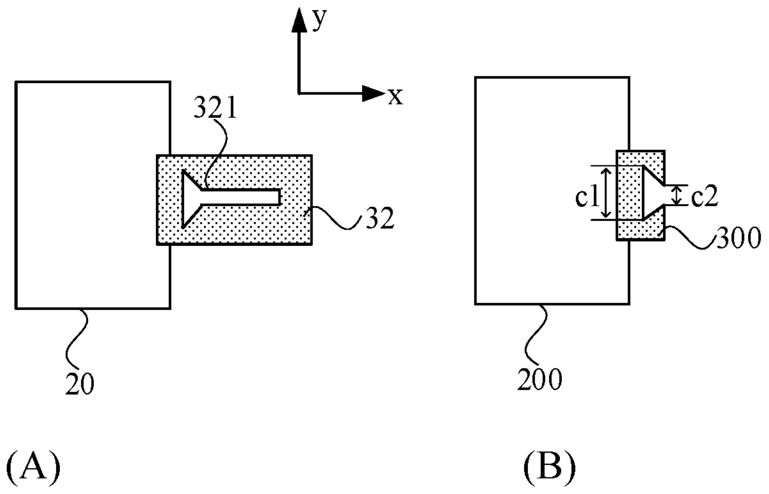
FIG. 28 is a comparison diagram of another second support portion before and after being broken according to an embodiment of the present application.

A guide structure is a hollow structure as an example. FIG. 28 is a comparison diagram of another second support portion before and after being broken according to an embodiment of the present application. Referring to FIG. 28, similar to FIG. 27, FIG. 28(A) shows the structure before being broken. FIG. 28(B) shows the structure after being broken. In this embodiment, the change of the width of the guide structure is set to facilitate the second support portion 32 to break at the position where the shape changes suddenly. The size c1 of the first end of the hollow structure in the second direction y is greater than the size c2 of the second end of the hollow structure in the second direction y.

Optionally, the display panel also includes an organic layer covering microdevices. The organic layer fills the hollow structure or the groove. The organic layer includes a photoresist or other organic function film layers. This is not limited in this embodiment of the present application.

The design of a guide structure in this embodiment of the present application is advantageous to reduce the residue of a support structure. However, due to the large number of microdevices are transferred, it is inevitable that part of support structures remains on part of the transferred microdevices. The subsequent process of the display panel includes steps of glue coating and packaging. To avoid problems, such as uneven coating and bubbles, caused by a glue material being blocked by the residual structure, the guide structure may be provided as a hollow structure.

Figure 29:
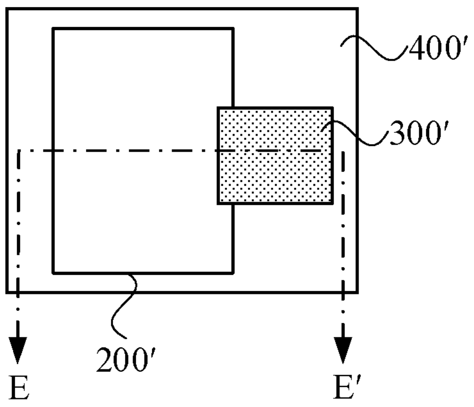
FIG. 29 is a partial diagram illustrating the structure of a display panel in the related art.
Figure 30:
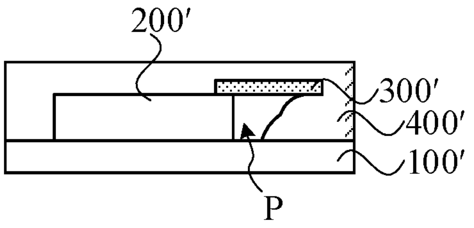
FIG. 30 is a sectional view taken along line EE' in FIG. 29.
Figure 31:
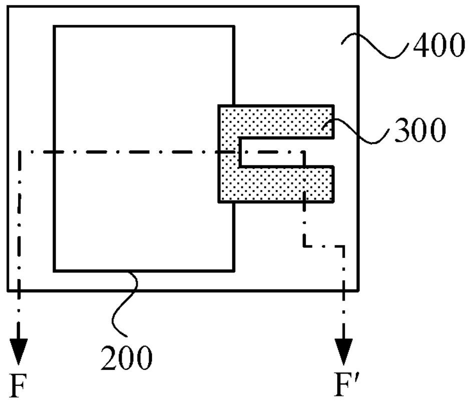
FIG. 31 is a diagram illustrating the structure of a display panel according to an embodiment of the present application.
Figure 32:
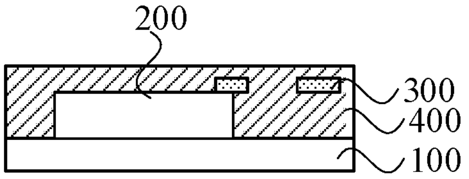
FIG. 32 is a sectional view taken along line FF' in FIG. 31.

When the guide structure is hollow, the flow of organic materials is facilitated, and uneven coating and bubbles are reduced. Exemplarily, FIG. 29 is a partial diagram illustrating the structure of a display panel in the related art. FIG. 30 is a sectional view taken along line EE' in FIG. 29. FIG. 31 is a diagram illustrating the structure of a display panel according to an embodiment of the present application. FIG. 32 is a sectional view taken along line FF' in FIG. 31. For simplicity, only one microdevice is illustratively shown in FIGS. 29 to 32. Referring to FIG. 29 and FIG. 30, a microdevice 200' carries a support portion residual structure 300'. A display panel includes a substrate 100', the microdevice 200', and an organic layer 400' covering the microdevice 200'. Since there is no hollow structure in the related art, the organic layer 400' may not completely fill the lower part of the microdevice 200' during coating, resulting in a bubble P. Referring to FIG. 31 and FIG. 32, a microdevice 200 carries a support portion residual structure 300. A display panel includes an organic layer 400 covering the microdevice 200. A hollow structure is disposed on the support portion residual structure 300. When the organic layer 400 is prepared, the organic layer 400 can penetrate downwardly through the hollow structure to fill a portion covered by the support portion residual structure 300, thereby improving problems such as uneven coating of the organic layer 400 and bubbles.

It is to be understood that when multiple hollow structures are provided in the support portion residual structure 300, the organic layer 400 can be penetrated more evenly, thereby improving problems such as uneven coating of the organic layer 400 and bubbles.

Figure 33:
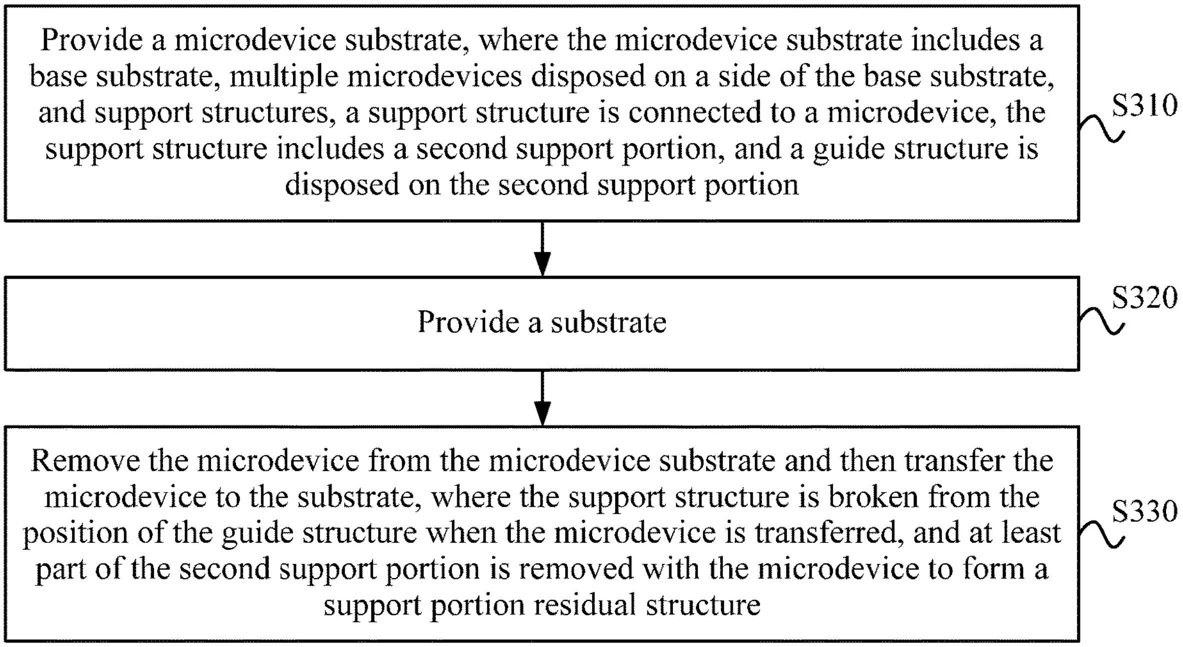
FIG. 33 is a flowchart of a method for preparing a display panel according to an embodiment of the present application.

FIG. 33 is a flowchart of a method for preparing a display panel according to an embodiment of the present application. The preparation method is used for preparing the display panel provided in the preceding embodiments. Referring to FIG. 33, the preparation method includes the following steps.

In S310, a microdevice substrate is provided. The microdevice substrate includes a base substrate, multiple microdevices disposed on a side of the base substrate, and support structures. A support structure is connected to a microdevice. The support structure includes a second support portion. A guide structure is disposed on the second support portion.

In S320, a substrate is provided.

In S330, the microdevice is removed from the microdevice substrate and then transferred to the substrate. The support structure is broken from the position of the guide structure when the microdevice is transferred. At least part of the second support portion is removed with the microdevice to form a support portion residual structure.

It is to be understood that, when the microdevice is removed from the microdevice substrate, the second support portion is broken by stress. Ideally, the second support portion is broken from the root close to the microdevice. Only the structure of the microdevice is transferred. However, in the actual operation, the second support portion cannot be completely broken from the root portion due to factors such as uneven stress. Therefore, part of the second support portion can form a support portion residual structure as the microdevice is removed, as shown in FIG. 27(B).

Figure 34:
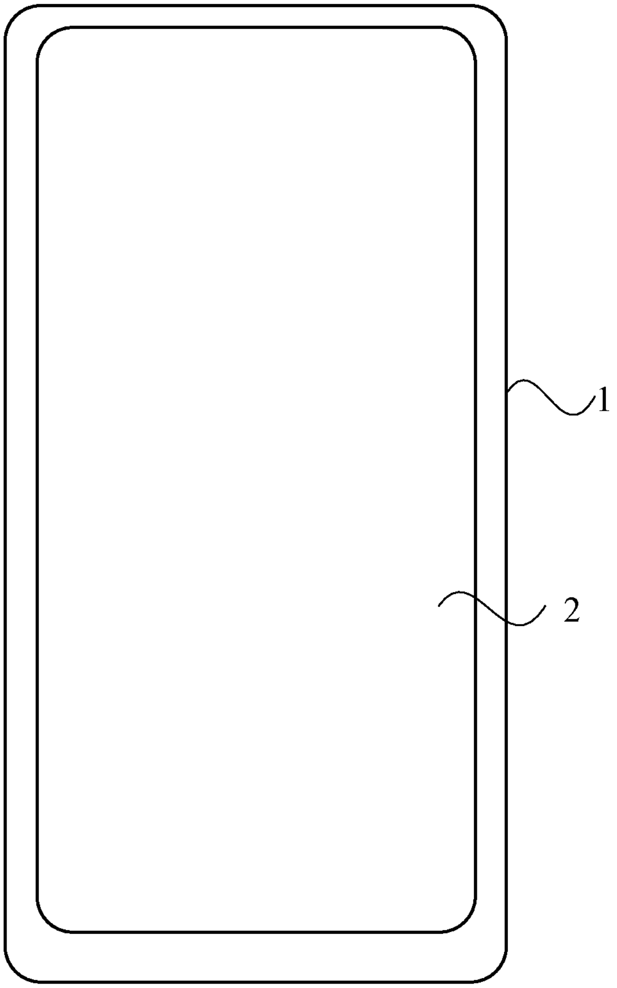
FIG. 34 is a diagram illustrating the structure of a display apparatus according to an embodiment of the present application.

FIG. 34 is a diagram illustrating the structure of a display apparatus according to an embodiment of the present application. Referring to FIG. 34, a display apparatus 1 includes a display panel 2 provided in any of the embodiments of the present application. The display apparatus 1 may be a display apparatus of various sizes such as a mobile phone, a computer, a smart wearable device, a television, a medical device, or an aviation device. Alternatively, multiple display panels 2 may be spliced to form a large screen to be applied to, for example, a billboard. This is not limited in the present application.

It is to be noted that the preceding are only preferred embodiments of the present application and the technical principles used therein. It is to be understood by those skilled in the art that the present application is not limited to the embodiments described herein. For those skilled in the art, various apparent modifications, adaptations, combinations, and substitutions can be made without departing from the scope of the present application. Therefore, while the present application has been described in detail via the preceding embodiments, the present application is not limited to the preceding embodiments and may include more equivalent embodiments without departing from the inventive concept of the present application. The scope of the present application is determined by the scope of the appended claims.

What is claimed is:

1. A microdevice substrate, comprising a base substrate and a plurality of microdevices disposed on one side of the base substrate; and a plurality of support structures connected to the plurality of microdevices, wherein a support structure of the support structures comprises a first support portion and a second support portion, the first support portion is fixedly connected to the base substrate, the second support portion is connected between a microdevice of the plurality of microdevices and the first support portion, and the microdevice and the second support portion are suspended on a same side of the base substrate; and a guide structure is disposed on the second support portion, and the guide structure affects a broken position of the second support portion after being stressed.

2. The microdevice substrate according to claim 1, wherein an orthographic projection of the guide structure on the base substrate extends along a first direction, and the first direction intersects an edge of the second support portion close to a side of the microdevice.

3. The microdevice substrate according to claim 2, wherein a plurality of guide structures are disposed on the second support portion, orthographic projections of the plurality of guide structures on the base substrate are arranged along a second direction, and the second direction intersects the first direction.

4. The microdevice substrate according to claim 2, wherein the guide structure comprises a first region and a second region which are communicated with each other, the first region is disposed between the second region and the microdevice, a size of the first region in a second direction is greater than a size of the second region in the second direction, and the second direction intersects the first direction.

5. The microdevice substrate according to claim 4, along a direction in which the second region points to the first region, at least one of the size of the first region or the size of the second region increases in the second direction.

6. The microdevice substrate according to claim 1, wherein the guide structure comprises at least one of a hollow structure or a groove.

7. The microdevice substrate according to claim 1, wherein at least one of the following applies:

at least two of the plurality of microdevices are connected to different numbers of second support portions, or relative positions of at least two of the plurality of microdevices and second support portions are different.

8. The microdevice substrate according to claim 7, wherein an orthographic projection of the microdevice on the base substrate is a polygon, at least part of the second support portions are connected to straight sides of the plurality of microdevices, and at least part of the second support portions are connected to corners of the plurality of microdevices.

9. The microdevice substrate according to claim 8, wherein the at least part of the second support portions are connected to a straight side of one of the plurality of microdevices, and the at least part of the second support portions is connected to a corner of another one of the plurality of microdevices.

10. The microdevice substrate according to claim 7, wherein at least part of the second support portions are connected to corners of the plurality of microdevices, a plurality of guide structures are disposed on at least one of the at least part of the second support portions, and orthogonal projections of the plurality of guide structures are radially arranged on the base substrate.

11. The microdevice substrate according to claim 1, wherein a side of the first support portion facing away from the base substrate is provided with a groove, and the groove is communicated with the guide structure disposed on at least one side of the first support portion.

12. A display panel, comprising a substrate and a plurality of microdevices disposed on a side of the substrate, wherein edges of a microdevice of at least part of the plurality of microdevices are connected to at least one support portion residual structure, and a support portion residual structure of the at least one support portion residual structure is provided with at least one of the following: at least one hollow structure, or at least one groove.

13. The display panel according to claim 12, wherein at least one of the following: an orthographic projection of the at least one hollow structure or an orthographic projection of the at least one groove on the substrate intersects orthographic projections of the plurality of microdevices on the substrate.

14. The display panel according to claim 12, wherein the support portion residual structure of the at least one support portion residual structure is provided with at least one of the following: a plurality of hollow structures or a plurality of grooves, orthographic projections of at least one of the following: the plurality of hollow structures or the plurality of grooves on the substrate extend along a first direction and are arranged along a second direction, wherein the first direction intersects an edge of the support portion residual structure close to a side of the microdevice, and the second direction intersects the first direction.

15. The display panel according to claim 14, wherein at least one of the following applies:

a size of a first end of a hollow structure of the plurality of hollow structures in the second direction is greater than a size of a second end of the hollow structure of the plurality of hollow structures in the second direction, and the first end of the hollow structure is disposed between the microdevice and the second end of the hollow structure; or a size of a first end of a groove of the plurality of grooves in the second direction is greater than a size of a second end of the groove of the plurality of grooves in the second direction, and the first end of the groove is disposed between the microdevice and the second end of the groove.

16. The display panel according to claim 12, further comprising an organic layer covering the plurality of microdevices, wherein the organic layer fills at least one of the following: the at least one hollow structure or the at least one groove.

17. A display apparatus, comprising a display panel, wherein the display panel comprises a substrate and a plurality of microdevices disposed on a side of the substrate, wherein edges of a microdevice of at least part of the plurality of microdevices are connected to at least one support portion residual structure, and a support portion residual structure of the at least one support portion residual structure is provided with at least one of the following: at least one hollow structure, or at least one groove.

* * * * *